United States Patent
Shibata et al.

(10) Patent No.: US 6,495,894 B2
(45) Date of Patent: Dec. 17, 2002

(54) PHOTONIC DEVICE, A SUBSTRATE FOR FABRICATING A PHOTONIC DEVICE, A METHOD FOR FABRICATING THE PHOTONIC DEVICE AND A METHOD FOR MANUFACTURING THE PHOTONIC DEVICE-FABRICATING SUBSTRATE

(75) Inventors: Tomohiko Shibata, Kasugai (JP); Keiichiro Asai, Nagoya (JP); Teruyo Nagai, Nagoya (JP); Mitsuhiro Tanaka, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/854,925

(22) Filed: May 14, 2001

(65) Prior Publication Data

US 2002/0020850 A1 Feb. 21, 2002

(30) Foreign Application Priority Data

| | | | |
|---|---|---|---|
| May 22, 2000 | (JP) | ........................ | 2000-149190 |
| May 22, 2000 | (JP) | ........................ | 2000-149191 |
| Sep. 27, 2000 | (JP) | ........................ | 2000-293763 |
| Sep. 27, 2000 | (JP) | ........................ | 2000-293846 |
| Apr. 12, 2001 | (JP) | ........................ | 2001-114065 |
| Apr. 12, 2001 | (JP) | ........................ | 2001-114067 |

(51) Int. Cl.$^7$ .......................... H01L 33/00; H01L 31/00
(52) U.S. Cl. ................... 257/428; 257/101; 257/103; 257/428
(58) Field of Search ................... 338/32 H; 257/425, 257/101, 103, 77, 96, 97; 372/43–46; 359/359, 361, 578

(56) References Cited

U.S. PATENT DOCUMENTS

| | | | | |
|---|---|---|---|---|
| 5,182,670 A | * | 1/1993 | Khan et al. | ............ 252/588 |
| 5,523,589 A | * | 6/1996 | Edmond et al. | ............ 257/103 |
| 5,883,564 A | * | 3/1999 | Partin | ............ 338/32 H |
| 6,133,589 A | * | 10/2000 | Krames et al. | ............ 257/103 |

FOREIGN PATENT DOCUMENTS

| | | | | | |
|---|---|---|---|---|---|
| JP | 5291618 A | * | 11/1993 | ............ | H01L/33/00 |
| JP | 05291618 A | | 11/1993 | | |
| JP | 09064477 A | | 3/1997 | | |
| JP | 9064477 | * | 7/1997 | ............ | H01S/3/18 |
| JP | 411261105 A | * | 9/1999 | ............ | H01L/33/00 |

OTHER PUBLICATIONS

U.S. patent application Ser. No. 10/156,595, Shibata et al., filed Aug. 28, 2002.
U.S. patent application Ser. No. 09/981,295, Tomohiko Shibata et al., filed Oct. 16, 2001.
U.S. patent application Ser. No. 10/102,545, Tomohiko Shibata et al., filed Mar. 20, 2002.
U.S. patent application Ser. No. 10/163,256, Tomohiko Shibata et al., filed Jun. 5, 2002.
U.S. patent application Ser. No. 10/074,589, Tomohiko Shibata et al., filed Feb. 13, 2002.

* cited by examiner

Primary Examiner—Chandra Chaudhari
Assistant Examiner—David L. Hogans
(74) Attorney, Agent, or Firm—Burr & Brown

(57) ABSTRACT

A buffer layer with a composition of AlaGabIncN (a+b+c=1, a, b, c≧0) and a multilayered thin films with a composition of AlxGayInzN (x+y+z=1, x, y, z≧0) are formed in turn on a substrate. The Al component of the Al component-minimum portion of the buffer layer is set to be larger than that of at least the thickest layer of the multilayered thin films. The Al component of the buffer layer is decreased continuously or stepwise from the side of the substrate to the side of the multilayered thin films therein.

15 Claims, 4 Drawing Sheets

PHOTONIC DEVICE, A SUBSTRATE FOR FABRICATING A PHOTONIC DEVICE, A METHOD FOR FABRICATING THE PHOTONIC DEVICE AND A METHOD FOR MANUFACTURING THE PHOTONIC DEVICE-FABRICATING SUBSTRATE

BACKGROUND OF THE INVENTION (1) Field of the Invention:

This invention relates to a photonic device such as a light-emitting device and a photodetector, and a substrate for fabricating such a photonic device, in which multilayered thin films made of III-V nitride semiconductor are epitaxially grown.

(2) Background of the Invention

A III-V nitride semiconductor material is commercially used for a photonic device such as a light-emitting device and a photodetector. As the above III-V nitride semiconductor material, an $Al_xGa_yIn_zN$ ($x+y+z=1$, $x, y, z \geq 0$) material is widely available, that is, each layer of the photonic device is composed of the $Al_xGa_yIn_zN$ film that is epitaxially grown by a MOCVD method. In this basic case, TMA (trimethyl aluminum) is employed as the Al raw material and TMG (trimethyl gallium) is employed as the Ga law material, and TMI (trimethyl indium) is employed as the In law material. Moreover, $NH_3$ is employed as the nitrogen raw material. $N_2$ gas and/or $H_2$ gas is used as a carrier gas.

Then, various control of the above raw materials in flow rate can change the composition of the $Al_xGa_yIn_zN$ film. An AlN film has its bandgap Eg of 6.2 eV, and a GaN film has its bandgap Eg of 3.4 eV. Therefore, in the case of forming an $Al_xGa_{1-x}N$ film using TMA and TMG, the $Al_xGa_{1-x}N$ film has substantially its bandgap of $6.2x+3.4(1-x)$eV, and has substantially its emission wavelength $\lambda=1240/\{6.2x+3.4(1-x)\}$ from an equation $\lambda=1240/Eg$. Given $x=0.3$, the emission wavelength $\lambda$ is 292 nm. In this case, the detection wavelength is below 292 nm.

In the case of fabricating a light-emitting diode from the $Al_xGa_yIn_zN$ ($x+y+z=1$, $x, y, z \geq 0$) multilayered thin films, when the $Al_xGa_yIn_zN$ film is epitaxially grown on a C-faced sapphire substrate by a MOCVD method, it includes large amount of defect, resulting in the deterioration of its crystallinity and thus the deterioration of its light-emitting efficiency.

From this point of view, it is proposed that the $Al_xGa_yIn_zN$ ($x+y+z=1$, $x, y, z \geq 0$) multilayered thin films is formed on the sapphire substrate via a buffer layer made of a GaN film which is epitaxially grown by a CVD at low temperature. The GaN buffer layer supplements the lattice constant of 10% and over between the sapphire substrate and the multilayered thin films, and provides a favorable crystallinity to the multilayered thin films. Instead of the GaN buffer layer, an AlN buffer layer may be employed.

A conventional light-emitting device as mentioned above can emit a light having only 400 nm or over. Therefore, the $Al_xGa_yIn_zN$ multilayered thin films are required to have a relatively large amount of the Al component in order to emit a short wavelength blue light or a short wavelength ultraviolet light. Moreover, for emitting a green to blue light, all the $Al_xGa_yIn_zN$ films except a light-emitting layer are required to have a relatively large amount of the Al components, respectively, in order to confine energy in the light-emitting layer effectively. However, if the Al-rich $Al_xGa_yIn_zN$ tin film is formed on the buffer layer, made of e.g. the GaN film or the AlN film, epitaxially grown by the CVD at low temperature, it may bring about cracks in the Al-rich $Al_xGa_yIn_zN$ thin film and deteriorate the crystallinity thereof.

The reason is that since the Al-rich $Al_xGa_yIn_zN$ thin film has a smaller lattice constant, a large tensile stress may be brought about in the thin film due to the large difference in the lattice constants between the thin film and the buffer layer if the thin film is formed on the buffer layer. Moreover, the lateral growth speed of the Al-rich $Al_xGa_yIn_zN$ thin film is very small, and thus, the enhancement of the crystallinity of the thin film is hindered by the poor crystalline buffer layer due to the low temperature epitaxial growth. Moreover, in a photodetector such as a UV photodetector, its detecting sensitivity is degraded due to the poor crystallinity of the buffer layer.

In order to iron out the above matters, such a light-emitting device having a Al-rich $Al_xGa_yIn_zN$ multilayered thin films on a buffer layer made of an $Al_xGa_{1-x}N$ ($1 \geq x > 0$) film is disclosed and proposed in the publication of unexamined patent application, Tokukai Hei 9-64477 (JP A 9-64477).

Moreover, such a light-emitting device is disclosed in the publication of unexamined patent application, Tokukai Hei 5-291628 that plural $Ga_{1-x-y}In_xAl_yN$ ($1 \geq x \geq 0$, $1 \geq x \geq 0$) thin films having their various x- and/or y-components are formed on a sapphire substrate to obtain a predetermined $Ga_{1-a-b}In_aAl_bN$ ($1 \geq a \geq 0$, $1 \geq b \geq 0$) buffer layer, and then, the $Ga_{1-a-b}In_aAl_bN$ ($1 \geq a \geq 0$, $1 \geq b \geq 0$) multilayered thin films are formed on the buffer layer.

In Tokukai Hei 9-64477, since the AlGaN buffer layer is formed at a relatively high temperature, the Al-rich $Al_xGa_yIn_zN$ multilayered thin films epitaxially grown on the buffer layer can have relatively favorable crystallinity and does not have cracks therein.

However, the AlGaN buffer layer requires to be formed at a high temperature of 1300° C. or over, and annealed at a high temperature of about 1500° C. after the formation of the buffer layer. Such a high temperature treatment overloads a heater in a MOCVD apparatus, resulting in the complication of the maintenance and the increase of the manufacturing cost.

Particularly, in realizing a photonic device to emit or detect an above-mentioned short wavelength light, since the required Al-rich $Al_xGa_yIn_zN$ multilayered thin films has its respective small vertical and lateral growth speed, its high film-forming temperature must be held for a long time, thus overloading a heater and so on of a MOCVD apparatus.

When the above AlGaN buffer layer having a thickness of 0.3 μm is formed at about 1200° C., many cracks come into being in the buffer layer and the crystallinity of the buffer layer is deteriorated. As a result, the entire crystallinity of the Al-rich $Al_xGa_yIn_zN$ multilayered thin films is deteriorated.

In Tokukai Hei 5-291618, since the $Ga_{1-a-b}In_aAl_bN$ ($1 \geq a \geq 0$, $1 \geq b \geq 0$) multilayered thin films is formed on the $Ga_{1-a-b}In_aAl_bN$ ($1 \geq a \geq 0$, $1 \geq b \geq 0$) buffer layer composed of the laminated plural $Ga_{1-x-y}In_xAl_yN$ ($1 \geq x \geq 0$, $1 \geq x \geq 0$) thin films having their various x- and/or y-components, it can have its favorable crystallinity and almost never have cracks therein. Moreover, since the buffer layer is formed at a low temperature of about 700° C., a heater in a MOCVD apparatus is not overloaded.

However, in the above conventional fabricating method, the multilayered thin films and the buffer layer have the same component and composition, so that they are continued though their boundaries. In this case, a leak current is flown to the buffer layer from the multilayered thin films, resulting in the reduction of the light-emitting efficiency of the light-emitting device having the multilayered thin films due to the resistance loss.

SUMMARY OF THE INVENTION

It is an object of the present invention to provide a photonic device having an AlaGabIncN (a+b+c=1, a, b, c≧0) buffer layer and an AlxGayInzN (x+y+z=1, x, y, z≧0) multilayered thin films without cracks epitaxially grown on the buffer layer which have their favorable crystallinities, and a substrate for fabricating the photonic device.

It is another object of the present invention to provide a method for fabricating the photonic device and a method for manufacturing the photonic device-fabricating substrate.

For achieving the above objects, this invention relates to a photonic device comprising a substrate, a buffer layer with a composition of AlaGabIncN a+b+c=1, a, b, c≧0) formed on the substrate and a multilayered thin films with a composition of AlxGayInzN (x+y+z=1, x, y, z≧0) epitaxially grown on the buffer layer, the Al component of the Al component-minimum portion of the buffer layer being set to be larger than that of at least the thickest layer of the multilayered thin films, the Al component of the buffer layer being decreased continuously or stepwise from the side of the substrate to the side of the multilayered thin films therein.

Moreover, this invention also relates to a substrate for fabricating a photonic device comprising a substrate, a buffer layer with a composition of AlaGabIncN a+b+c=1, a, b, c≧0) formed on the substrate, the Al component of the Al component-minimum portion of the buffer layer being set to be larger than that of at least the thickest layer of the multilayered thin films to constitute the photonic device, the Al component of the buffer layer being decreased continuously or stepwise from the side of the substrate to the side of the multilayered thin films therein.

In the present invention, the Al component of the Al component-minimum portion of the buffer layer is set to be larger than that of at least the thickest layer of the multi-layered thin films. This requisite is for preventing cracks in the multilayered thin films. The largest tensile stress may occur in the thickest layer of the multilayered thin films, so that cracks may be also likely to occur in the thickest layer. Therefore, a compressive stress is brought about according to the above requisite for preventing the occurrence of the cracks.

Moreover, in the present invention, the Al component of the buffer layer is decreased continuously or stepwise from the side of the substrate to the side of the multilayered thin films.

If the buffer layer is formed at a low temperature of about 1200° C., it requires to be formed thick, e.g. 1 μm to 2 μm to obtain its good crystallinity. However, such a thick buffer layer has a large tensile stress therein because the lattice constant of the buffer layer is increased, so that cracks may come into being in the buffer layer.

FIGS. 1 and 2 are graphs explaining the above phenomenon. In FIG. 1, the horizontal axis designates the thickness of the AlN portion adjacent to the substrate of the buffer layer, and the longitudinal axis designates the FWHM of X-ray rocking curve at (002) peak of the AlN portion to evaluate the crystallinity of the AlN portion. As is apparent from FIG. 1, as the thickness of the AlN portion is increased, the FWHM is decreased and thus, the crystallinity of the AlN portion is be developed.

In FIGS. 2A and 2B, the horizontal axis designates the thickness of the AlN portion of the buffer layer, and the longitudinal axes designate the lattice constants "a" and "c" of the bottom surface of the hexagonal columnar crystal of the AlN portion shown in FIG. 3, respectively. The heavy line designates ideal lattice constants "a" and "c" of an AlN film having a hexagonal columnar crystal, respectively. As is apparent from FIG. 2, as the thickness of the AlN portion is increased, the lattice constant "a" is elongated and the lattice constant "b" is shrunk.

Therefore, as the thickness of the AlN portion adjacent to the substrate of the buffer layer is increased, the crystallinity of the AlN portion is enhanced and the bottom surface lattice constant "a" is increased. As a result, as the thickness of the buffer layer made of the AlaGabIncN (a+b+c=1, x, y, z≧0) is increased, a tensile stress occur in the buffer layer horizontally and thus, cracks are likely to come into being.

In order to prevent the cracks, it is considered that the upper side of the buffer layer is made of a large lattice constant material before the some cracks come into being in the buffer layer. As the Al component of the AlaGabIncN (a+b+=1, a, b, c≧0) is decreased, the lattice constant thereof is increased. Therefore, according to the present invention, if the Al component of the AlaGabIncN constituting the buffer layer is decreased continuously or stepwise from the side of the substrate to the side of the multilayered thin film to constitute the photonic device, the lattice constant of the upper side of the buffer layer is increased, so that the tensile stress does not occur and thus, the cracks are prevented even though the buffer is formed thick at a low temperature of about 1200° C.

Moreover, if the buffer layer includes the Ga component from the AlaGabIncN (a+b+c=1, a, b, c≧0), the lateral growth speed of the buffer layer can be developed, so that the amount of dislocation in the buffer layer can be reduced.

In a preferred embodiment of the photonic device according to the present invention, the Al component-maximum layer of the multilayered thin films is made of AlxGayInzN (x+y+z=1, 1.0≧X≧0.3) suitable for a short wavelength light-emitting device or a short wavelength photodetector.

In another preferred embodiment of the present invention, the Al component-minimum portion is made of AlaGabIncN (a+b+c=1, 1.0≧a≧0.5), preferably AlaGabIncN (a+b+c=1, 1.0≧a≧0.7).

In still another preferred embodiment of the present invention, the adjacent portion to the substrate of the buffer layer has a composition of AlN. In this case, since the buffer layer can have a large degree of freedom for the Al component therein, the above requirement of the present invention can be easily satisfied. As a result, a photonic device having the multilayered thin films without cracks having their favorable crystallinities can be provided efficiently.

In a further preferred embodiment of the present invention, an interface to divide the buffer layer upward and downward by 10 atomic % or more of Al component is formed in the buffer layer. Particularly, in the photonic device of the present invention, it is desired that an interface to divide the buffer layer and the multilayered thin films by 10 atomic % or more of Al component is formed. If the buffer layer or the photonic device has such a large Al component step therein, dislocations can not travel upward through the large Al component step. As a result, dislocations in the upper side from the above interface, that is, the large Al-component step, can be reduced and thus, the crystallinity of the multilayered thin films can be enhanced.

Furthermore, this invention relates to a method for fabricating a photonic device comprising the steps of preparing a substrate, forming a buffer layer with a composition of AlaGabIncN (a+b+c=1, a, b, c≧0) by a MOCVD method, and epitaxially growing a multilayered thin films with a composition of AlxGayInzN (x+y+z=1, x, y, z≧0) by a MOCVD method, on condition that the Al component of the Al component-minimum portion of the buffer layer is set to be larger than that of at least the thickest layer of the multilayered thin films, and the Al component of the buffer layer is decreased continuously or stepwise from the side of the substrate to the side of the multilayered thin films therein.

Moreover, this invention relates to a method for manufacturing a photonic device-fabricating substrate comprising the steps of preparing a substrate, and forming a buffer layer with a composition of AlaGabIncN (a+b+c=1, a, b, c≧0) by a MOCVD method, on condition that the Al component of the Al component-minimum portion of the buffer layer is set to be larger than that of at least the thickest layer of the multilayered thin films to constitute the photonic device, and the Al component of the buffer layer being decreased continuously or stepwise from the side of the substrate to the side of the multilayered thin films therein.

In a preferred embodiment of the present invention related to the method for fabricating a photonic device and the method for manufacturing a photonic device-fabricating substrate, the buffer layer is formed at a higher film-forming temperature than that of the multilayered thin films to constitute the photonic device. Thereby, the crystallinity of the buffer layer including a larger amount of Al component than that of the multilayered thin films can be enhanced effectively.

Concretely, the buffer layer is formed at 1100° C. or over. Moreover, the buffer layer is preferably formed at a temperature less than 1300° C., as mentioned above, for mitigating load to some components such as a heater in a MOCVD apparatus. From this point of view, the buffer layer of the present invention may be called as a "high temperature buffer layer", compared with the above conventional buffer layer epitaxially grown at a low temperature of about 700° C.

Moreover, it is desired that carrier gas flow rate ratio ($H_2$ carrier gas flow rate/$N_2$ carrier gas flow rate) in forming the buffer layer is set to be larger than the one in forming the multilayered thin films.

Furthermore, it is desired that raw material gas flow rate ratio (V raw material gas flow rate/III raw material gas flow rate) in forming the buffer layer is set to be larger than the one in forming the multilayered thin films. Herein, the flow rate of the III raw material gas is calculated from its saturated vapor pressure, provided that the III raw material gas is not polymerized, for example, dimerized.

In addition, in using a III raw material gas including Al component, an average gas flow rate including the above raw material gases and the above carrier gas above the substrate in the reactor of a MOCVD apparatus is preferably set to be 1 m/sec or over. The average gas flow rate is obtained from the following equation (1):

{Summation of gas flow rates converted at 0° C. (L/min)/60×$10^3$× cross sectional area above the substrate in the reactor of a MOCVD apparatus ($m^2$)}×{760/pressure inside the reactor (Torr)} (1)

That is, as the summation of the gas flow rates is increased, and/or the cross sectional area of the reactor is decreased, and/or the pressure inside the reactor is decreased, the average gas flow rate is increased. When the average gas flow rate is set to be 1 m/sec or over, the raw material gases do not almost react one another in a vapor phase in the reactor of the MOCVD apparatus, so that the crystallinity of the buffer layer can be developed effectively.

Moreover, in the method for fabricating a photonic device and the method for manufacturing a photonic device-fabricating substrate of the present invention, preferably, an interface to divide the buffer layer upward and downward by 10 atomic % or more of Al component is formed in the buffer layer. Particularly, in the method for fabricating a photonic device of the present invention, preferably, an interface to divide the buffer layer and the multilayered thin films by 10 atomic % or more of Al component is formed. Thereby, the crystallinity of the multilayered thin films can be developed through the reduction of dislocations in the multilayered thin films.

BRIEF DESCRIPTION OF THE DRAWINGS

For better understanding of the present invention, reference is made to the attached drawings, wherein.

DETAILED DESCRIPTION OF THE INVENTION

Figure 1:
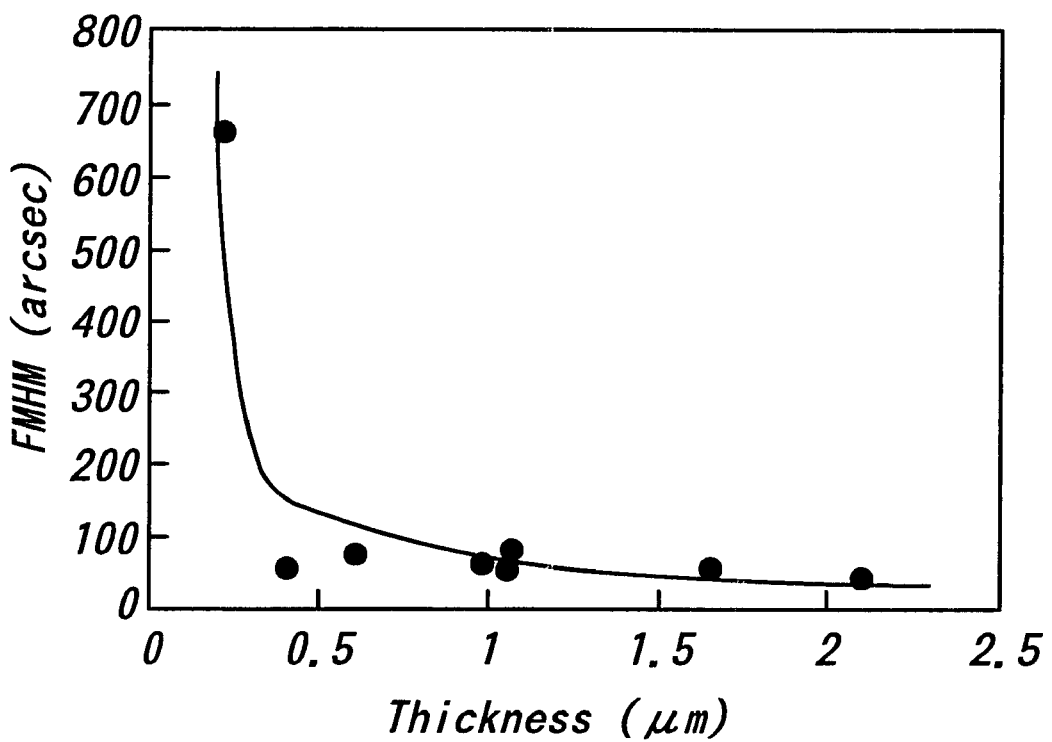
FIG. 1 is a graph showing the relation between a thickness of an AlN portion adjacent to a substrate of a buffer layer and the crystallinity of the buffer layer.
Figure 2A:
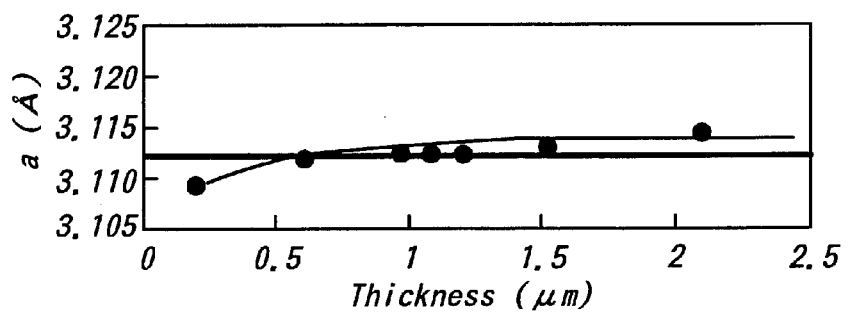
FIGS. 2A and 2B are graphs showing the relations between the AlN portion of the buffer layer and the lattice constants "a" and "b" of the AlN portion.
Figure 2B:
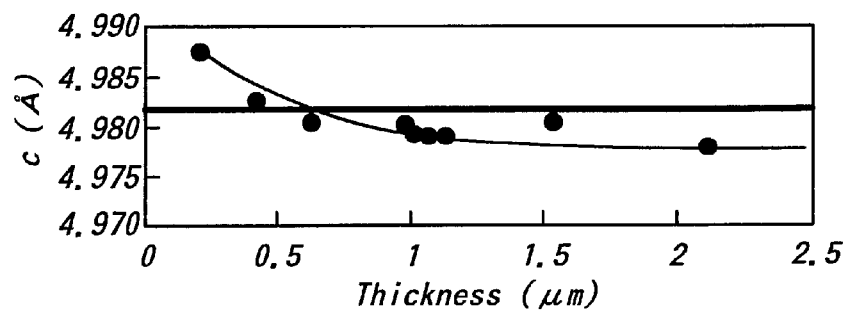
Figure 3:
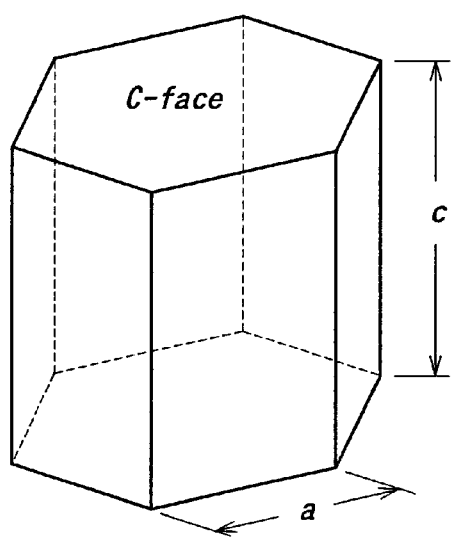
FIG. 3 is a schematic view showing a crystal structure of an AlN film.
Figure 4:
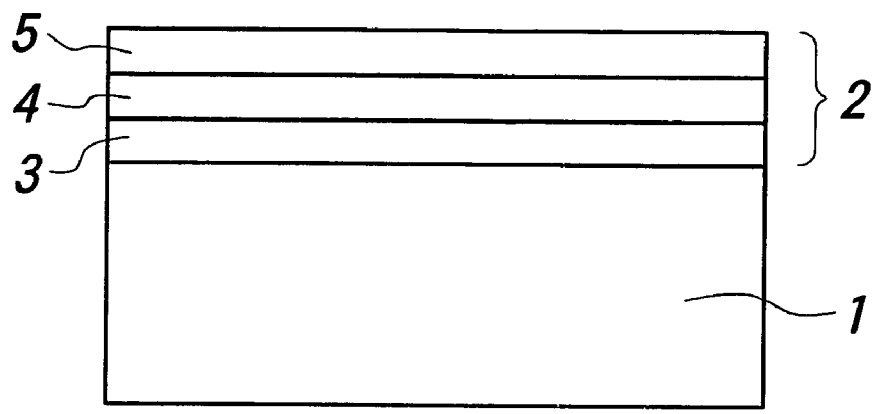
FIG. 4 is a cross sectional view showing a step in an embodiment of a method for fabricating a light-emitting device as a photonic device, according to the present invention.
Figure 5:
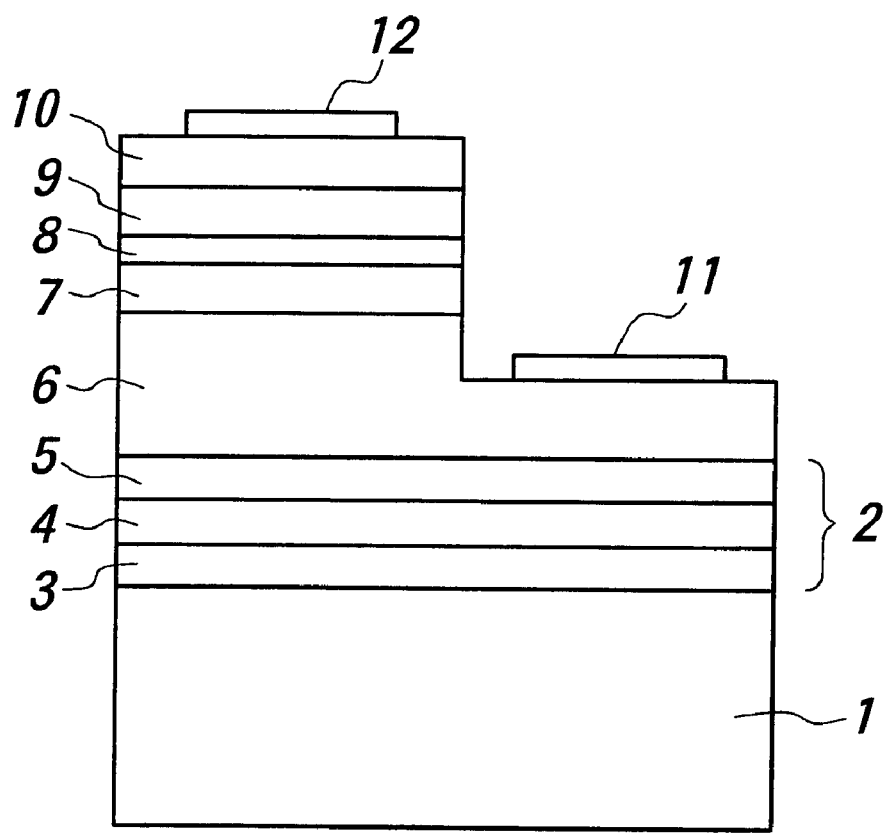
FIG. 5 is a cross sectional view showing a step after the step shown in FIG. 4.

FIGS. 4 and 5 show manufacturing steps for an ultraviolet light-emitting device as a photonic device according to the present invention. First of all, a C-faced sapphire ($Al_2O_3$) substrate 1 is set into the reactor of a MOCVD apparatus. Then, the substrate 1 is heated to about 1200° C., and TMA gas as a III raw material gas and $NH_3$ gas as a V raw material gas are introduced into the reactor of the MOCVD apparatus with $H_2$ carrier gas, on condition that the total pressure is 15 Torr and the total gas flow rate is 10 L/min, thereby to form an AlN film 3 in a thickness of about 0.5 $\mu$m.

Moreover, in this case, raw material gas flow rate ratio (V raw material gas flow rate/III raw material gas flow rate) is set to 450, and a film-forming rate is set to 1 $\mu$m/hour by controlling the supply of the above raw material gases. Furthermore, in this case, carrier gas flow rate ratio ($H_2$ carrier gas flow rate/$N_2$ carrier gas flow rate) is set to be infinite. Since the reactor of the MOCVD apparatus has a laterally elongated shape and the cross sectional area of the reactor above the substrate 1 is 5×$10^{-3}m^2$, the average gas flow rate is 1.7 m/sec calculated from the equation (1).

Then, TMG gas as a III raw material gas is introduced into the reactor of the MOCVD apparatus to form an $Al_{0.985}Ga_{0.015}N$ film 4 in a thickness of about 0.5 $\mu$m. The flow rate ratio (TMA gas/TMG gas) being varied, an $Al_{0.85}Ga_{0.15}N$ film 5 is formed in a thickness of about 0.5 μm. The other conditions such as a total gas pressure are set to be similar to the above ones. As a result, a buffer layer 2 composed of the AlN film 3, the $Al_{0.985}Ga_{0.015}N$ film 4 and the $Al_{0.85}Ga_{0.15}N$ film 5 is formed on the substrate 1. The substrate 1 and the buffer layer 2 construct a photonic device according to the present invention. Moreover, in this embodiment, the buffer layer 2 has an AlN portion made of the AlN film 3 adjacent to the substrate 1.

In this case, the FWEM of X-ray rocking curve at (002) peak of the buffer layer is 50 arcsec. Moreover, an interface to divide the AlGaN films 4 and 5 by 10% or more of Al component is formed. Therefore, even though the AlGaN film 4 includes a large amount of dislocation, the AlGaN film 5 does not include such a large amount of dislocation because dislocation travel beyond the interface is prevented effectively.

Then, multilayered thin films are formed through epitaxial growth on the buffer layer 2 by a MOCVD method. The multilayered thin films may be formed in another MOCVD apparatus after the substrate 1 with the buffer layer 2 is taken out of the reactor of the MOCVD apparatus and set into another MOCVD apparatus. In this embodiment, the multilayered thin films are formed in the same MOCVD apparatus continuously.

In forming the multilayered thin films, the substrate temperature is set to 1050° C. lower than 1200° C. at which the buffer layer is formed. Then, the carrier gas flow rate ratio ($H_2$ carrier gas flow rate/$N_2$ carrier gas flow rate) is set to "1", which is much smaller than the one in forming the buffer layer 2, and the raw material gas flow rate ratio (V raw material gas flow rate/III raw material gas flow rate) is set to "2000", which is much larger than the one in forming the buffer layer 2.

That is, in this embodiment, the carrier gas flow rate ratio in forming the buffer layer 2 is set be larger than the one in forming the multilayered thin films. Thereby, the crystallinity of the buffer layer is developed due to the large amount of $H_2$ carrier gas. In the case that the carrier gas flow rate in forming the buffer layer 2 is set to be almost equal to the one in forming the multilayered thin films without $H_2$ carrier gas, the crystallinity of the buffer layer 2 is degraded, and thus, the FWHM of X-ray rocking curve at (002) peak of the buffer layer 2 is decreased up to more than 100 arcsec.

Moreover, in this embodiment, since the raw material gas flow rate ratio in forming the buffer layer 2 is set to be smaller than the one in forming the multilayered thin films, the crystallinity of the buffer layer 2 is also developed.

In forming the multilayered thin films, if the carrier gas flow rate ratio is increased and the raw material gas flow rate ratio is decreased, the light-emitting efficiency of the light-emitting device to be fabricated may be deteriorated. The reason is that the multilayered thin films made of the AlxGayInzN films having a large amount of Al-component and/or Ga-component suffers from etching due to the large amount of $H_2$ gas, resulting in the degradation of the crystallinity of the multilayered thin films. As a result, the light-emitting efficiency is deteriorated, and worse, other electric characteristics are deteriorated.

Concretely, the multilayered thin films are formed as follows: As shown in FIG. 5, first of all, an n-type GaN film 6 is formed in a thickness of 3 μm on the buffer layer 2. In this case, since an interface to divide the buffer layer 2 and the multilayered thin films to be formed by 10% or more of Al component is formed, dislocations in the GaN film 6 can be reduced even though the buffer layer 2, particularly the AlGaN film 5 includes many dislocations, as mentioned above.

Then, an n-type $Al_{0.10}Ga_{0.90}N$ film 7 is formed in a thickness of 0.1 μm on the GaN film 6. Subsequently, an i-$In_{0.15}Ga_{0.85}N$ film 8 as a light-emitting layer is formed in a thickness of 0.05 μm on the $Al_{0.10}Ga_{0.90}N$ film 7. Moreover, a p-type $Al_{0.10}Ga_{0.90}N$ film 9 is formed in a thickness of 0.05 μm on the i-$In_{0.15}Ga_{0.85}N$ film 8. Then, a low resistance p-type GaN film 10 is formed in a thickness of 0.5 μm on the $Al_{0.10}Ga_{0.90}N$ film 9. The multilayered thin films are composed of the GaN film 6, the $Al_{0.10}Ga_{0.90}N$ film 7, the i-$In_{0.15}Ga_{0.85}N$ film 8, the $Al_{0.10}Ga_{0.90}N$ film 9 and the GaN film 10.

Last of all, the GaN film 6 through the GaN film 10 are partially etched and removed in their thickness direction to expose a part of the GaN film 6. Then, a pair of electrodes 11 and 12 are provided on the exposed surface of the GaN film 6 and the low resistance GaN film 10, respectively, thereby to complete the light-emitting device.

In this case, since the thickest GaN film 6 of the multilayered thin films does not include Al-component at all, the requisite of the Al component of the Al component-minimum portion of the buffer layer being larger than that of at least the thickest layer of the multilayered thin films is satisfied.

In a modified embodiment of the above light-emitting device according to the present invention, an ntype AlGaInN film 6 having Al component ratio of 0.8 is formed in a thickness of 1–2 μm on the buffer layer 2 as shown in FIG. 5. Then, an n-type AlGaInN film 7 having Al component ratio of 0.5 is formed in a thickness of about 0.5 μm on the AlGaInN film 6. In this case, since an interface to divide the AlGaInN films 6 and 7 by 10% or over of Al component is formed, dislocation in the AlGaInN film 7 can be reduced even though the AlGaInN film 6 includes many dislocations, as mentioned above.

Then, an i-AlGaInN film 8 having Al component ratio of 0.4, as a light-emitting layer, is formed in a thickness of about 0.1 μm on the AlGaInN film 7. Subsequently, a p-type AlGaInN film 9 having Al component ratio of 0.5 is formed in a thickness of 0.5 μm on the AlGaInN film 8, and a low resistance AlGaInN film 10 having Al component of 0.1 or below is formed in a thickness of about 0.5 μm on the AlGaInN film 9. In this embodiment, the multilayered thin films are also constructed of the AlGaInN films 6–10. Moreover, the photonic device-fabricating substrate is also constructed of the substrate 1 and the buffer layer 2.

Last of all, the AlGaInN films 6–10 are partially etched and removed in their thickness direction, thereby to expose a part of the AlGaInN film 6. Then, a pair of electrodes 11 and 12 are provided on the exposed surface of the AlGaInN film 6 and the AlGaInN film 10, respectively.

In this embodiment, the Al component of the Al component-minimum portion of the buffer layer 2 is set to be larger than that of the thickest AlGaInN film 6.

Figure 6:
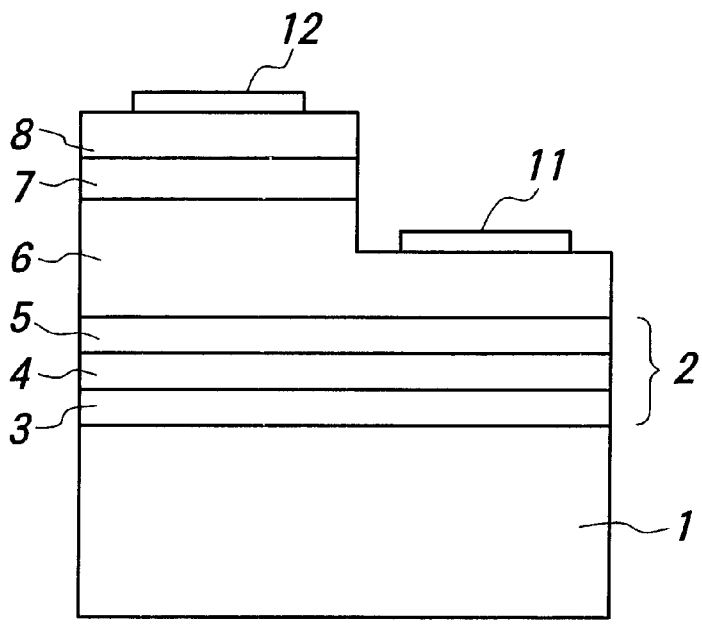
FIG. 6 is a cross sectional view showing the light-emitting device according to the present invention.

FIG. 6 shows a PIN-type photodiode with ultraviolet sensitivity region as a photonic device according to the present invention. In the photodiode depicted in FIG. 6, a buffer layer 2 composed of an AlN film 3, an $Al_{0.985}Ga_{0.15}N$ film 4 and an $Al_{0.85}Ga_{0.15}N$ film 5 is formed on a substrate 1 made of, for example C-faced sapphire single crystal. Then, an n-type AlGaInN film 6 with Al component ratio of 0.5 is formed in a thickness of 1–2 μm on the buffer layer 2.

Then, a non-doped AlGaInN film 7 with Al component ratio of 0.5 is formed in a thickness of 100Å on the AlGaInN film 6, and a p-type AlGaInN film 8 with Al component ratio of 0.15 is formed in a thickness of 100 nm on the AlGaInN film 7. Last of all, the AlGaInN films 6–8 are partially etched and removed in their thickness direction to expose a part of the AlGaInN film 6. Then, a pair of electrodes 11 and 12 are provided on the exposed surface of the AlGaInN film 6 and the AnGaInN film 8, respectively, thereby to complete the PIN-type photodiode. In this embodiment, the multilayered thin films are also constructed of the AlGaInN films 6–8. Moreover, the photonic device-fabricating substrate is also constructed of the substrate 1 and the buffer layer 2.

If the electrode 12 is made of a transparent conductive material, it may be used as a detecting surface of the photodiode. Moreover, the substrate 1 is made of a transparent material such as the above-mentioned sapphire single crystal; it may be used as a detecting surface of the photodiode.

Figure 7:
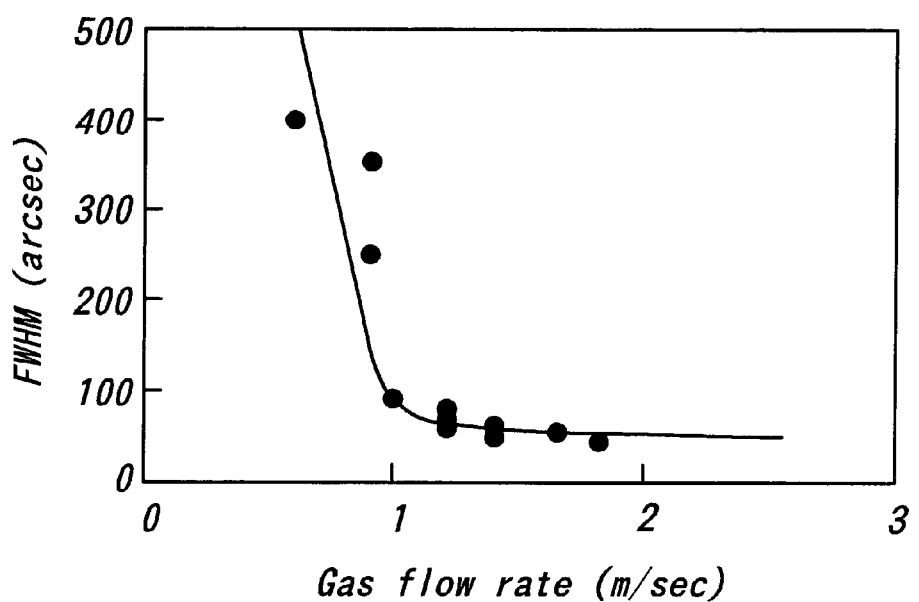
FIG. 7 is a graph showing the relation between an average gas flow rate and the crystallinity of the buffer layer in forming the buffer layer.

In all the above embodiments, it is desired that the buffer layer 2 is formed at an average gas flow rate of 1 m/sec or over calculated from the equation (1). FIG. 7 shows a graph showing the relation between an average gas flow rate and the crystallinity of the buffer layer. The horizontal axis designates the average gas flow rate, and the longitudinal axis designates the FWHM of X-ray rocking curve at (002) peak of the buffer layer. Plots depicted in FIG. 7 are calculated from the equation (1) using various gas flow rates, various cross sectional areas of reactors of MOCVD apparatuses and various reactor pressures. As is apparent from FIG. 7, if the average gas flow rate is set to 1 m/sec or over, the FWHM is decreased up to 90 arcsec or below and thus, the crystallinity of the buffer layer 2 can be developed.

Although the present invention was described in detail with reference to the above examples, this invention is not limited to the above disclosure and every kind of variation and modification may be made without departing from the scope of the present invention.

For example, the substrate 1 may be made of oxide crystal such as ZnO, and semiconductor crystal such as SiC, Si, GaAs or GaN, instead of the above sapphire crystal. Moreover, in the case of making the substrate of the sapphire crystal, any crystal surface can be employed instead of the C-faced crystal surface.

Moreover, in the above embodiments, although the ultraviolet light-emitting device and the PIN type photodiode are exemplified, the present invention can be applied for another type light-emitting device such as a blue light-emitting device or a laser diode and another type photodetector such as a schottky type photodiode.

As mentioned above, according to the present invention, a photonic device having an AlaGabIncN (a+b+c=1, a, b, c≧0) buffer layer and an AlxGayInzN (x+y+z=1, x, y, z≧0) multilayered thin films without cracks epitaxially grown on the buffer layer which have their favorable crystallinities, and a substrate for fabricating the photonic device can be provided.

Moreover, a method for fabricating the photonic device and a method for manufacturing the photonic device-fabricating substrate can be provided.

What is claimed is:

1. A photonic device comprising a substrate, a buffer layer with a composition of $Al_aGa_bIn_cN$ (a+b+c=1, a, b, c≧0) formed on the substrate and multilayered thin films with a composition of $Al_xGa_yIn_zN$ (x+y+z=1, x, y, z≧0) epitaxially grown on the buffer layer, the Al component of the Al component-minimum portion of the buffer layer being set to be larger than that of at least a thickest layer of the multilayered thin films, the Al component of the buffer layer being decreased continuously or stepwise from a first side proximate the substrate to a second side of the buffer layer proximate the multilayered thin films.

2. A photonic device as defined in claim 1, wherein the Al component-minimum portion of the buffer layer has a composition of $Al_aGa_bIn_cN$ (a+b+c=1, 1.0≧a≧0.05).

3. A photonic device as defined in claim 1, wherein a portion of the buffer layer adjacent to the substrate has a composition of AlN.

4. A photonic device as defined in claim 1, wherein the buffer layer has a FWHM of X-ray rocking curve at (002) peak not more than 90 arcsec.

5. A photonic device as defined in claim 1, wherein the thickest layer of the multilayered thin films has a composition of $Al_xGa_yIn_zN$ (x+y+z=1, 1.0≧x≧0.3).

6. A photonic device as defined in claim 1, wherein portions of the buffer layer are divided by at least one interface, and at least one of said portions of the buffer layer has 10 atomic % or more of the Al component tan an adjacent portion of the buffer layer in a direction from said first side to said second side or said second side to said first side.

7. A photonic device as defined in claim 1, wherein the buffer layer and the multilayered thin films are supported by the substrate.

8. A substrate for fabricating a photonic device comprising a substrate, and a buffer layer with a composition of $Al_aGa_bIn_cN$ (a+b+c=1, a, b, c≧0) formed on the substrate, the Al component of the Al component-minimum portion of the buffer layer being set to be larger than that of at least the thickest layer of multilayered thin films to constitute the photonic device, the Al component of the buffer layer being decreased continuously or stepwise from a first side proximate the substrate to a second side of the buffer layer proximate the multilayered thin films.

9. A substrate for fabricating a photonic device as defined in claim 8, wherein The Al component-minimum portion of the buffer layer has a composition of $Al_aGa_bIn_cN$ (a+b+c=1, 1.0 ≧a≧0.5).

10. A substrate for fabricating a photonic device as defined in claim 8, wherein a portion of the buffer layer adjacent to the substrate has a composition of AlN.

11. A substrate for fabricating a photonic device as defined in claim 8, wherein the buffer layer has a FWHM of X-ray rocking curve at (002) peak not more than 90 arcsec.

12. A substrate for fabricating a photonic device as defined in claim 8, wherein portions of the buffer layer are divided by at least one interface, and at least one of said portions of the buffer layer has 10 atomic % or more of the Al component than an adjacent portion of the buffer layer in a direction from said first side to said second side or said second side to said first side.

13. A substrate for fabricating a photonic device as defined in claim 8, wherein the buffer layer is supported by the substrate.

14. A photonic device as defined in claim 1, wherein at least a portion of the buffer layer and the multilayered thin films are divided by an interface, said portion of the buffer layer having 10 atomic % or more of the Al component than one of an adjacent multilayered film.

15. A substrate for fabricating a photonic device as defined in claim 8, wherein at least a portion of the buffer layer and the multilayered thin films are divided by an interface, said portion of the buffer layer having 10 atomic % or more of the Al component than one of an adjacent multilayered film.

* * * * *

UNITED STATES PATENT AND TRADEMARK OFFICE
CERTIFICATE OF CORRECTION

PATENT NO.    : 6,495,894 B2
DATED         : December 17, 2002
INVENTOR(S)   : Tomohiko Shibata et al.

It is certified that error appears in the above-identified patent and that said Letters Patent is hereby corrected as shown below:

<u>Title page,</u>
Item [57], ABSTRACT,
Please delete the ABSTRACT in its entirety and replace with the following ABSTRACT:

-- A buffer layer with a composition of $Al_aGa_bIn_cN$ ($a+b+c=1$, $a, b, c \geq 0$) and multilayered thin films with compositions of $Al_xGa_yIn_zN$ ($x+y+z=1$, $x, y, z \geq 0$) are formed on a substrate. The Al component of the Al component-minimum portion of the buffer layer is set to be larger than that of at least the thickest layer of the multilayered thin films. The Al component of the buffer layer is decreased continuously or stepwise from the side of the substrate to the side of the multilayered thin films therein. --

Signed and Sealed this

Twenty-second Day of April, 2003

JAMES E. ROGAN
*Director of the United States Patent and Trademark Office*